US006566187B1

(12) United States Patent
Willer et al.

(10) Patent No.: US 6,566,187 B1
(45) Date of Patent: May 20, 2003

(54) DRAM CELL SYSTEM AND METHOD FOR PRODUCING SAME

(75) Inventors: Josef Willer, Riemerling (DE); Franz Hoffmann, München (DE); Till Schlösser, Dresden (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/806,614

(22) PCT Filed: Sep. 17, 1999

(86) PCT No.: PCT/DE99/02937
§ 371 (c)(1),
(2), (4) Date: May 11, 2001

(87) PCT Pub. No.: WO00/19527
PCT Pub. Date: Apr. 6, 2000

(30) Foreign Application Priority Data

Sep. 30, 1998 (DE) ......................... 198 45 058

(51) Int. Cl.⁷ .......................................... H01L 21/8242
(52) U.S. Cl. ........................................ 438/239; 438/249
(58) Field of Search ................................. 438/239, 246, 438/249, FOR 212, FOR 189

(56) References Cited

U.S. PATENT DOCUMENTS

| 4,830,978 A | * | 5/1989 | Teng et al. ................ 257/302 |
| 4,958,206 A | * | 9/1990 | Teng et al. ................ 257/305 |
| 4,999,312 A | * | 3/1991 | Yoon ........................ 279/100 |
| 5,376,575 A | * | 12/1994 | Kim et al. .................. 438/239 |
| 5,519,236 A | * | 5/1996 | Ozaki ........................ 257/302 |
| 5,629,226 A |   | 5/1997 | Ohtsuki |
| 6,063,658 A | * | 5/2000 | Horak et al. ............... 438/248 |
| 6,225,158 B1 | * | 5/2001 | Furukawa et al. ........ 438/242 |
| 6,436,836 B2 | * | 8/2002 | Gobel |
| 6,440,793 B1 | * | 8/2002 | Divakaruni et al. |
| 2002/0085434 A1 | * | 7/2002 | Mandelman et al. |

FOREIGN PATENT DOCUMENTS

| EP | 0 489 257 A | 6/1992 |
| EP | 0 713 253 A | 5/1996 |
| EP | 0 852 396 A | 7/1998 |
| JP | 01 253956 A | 10/1989 |

OTHER PUBLICATIONS

Densest Dram Cell, IBM Technical Disclosure Bulletin, US, IBM Corp., New York, vol. 32, No9A, Feb. 1, 1990, pp. 380–382.

* cited by examiner

Primary Examiner—George Fourson
Assistant Examiner—Suk-San Foong
(74) Attorney, Agent, or Firm—Welsh & Katz, Ltd.

(57) ABSTRACT

DRAM cell arrangement and method for fabricating it Word lines and bit lines are arranged above a main area of a substrate, with the result that they have a planar construction and can be produced together with gate electrodes of transistors of a periphery of the cell arrangement. A depression of the substrate is provided per memory cell, a storage node of a storage capacitor being arranged in the lower region of said depression and a gate electrode of a vertical transistor being arranged in the upper region of said depression. The depressions of the memory cells are arranged between trenches filled with isolating structures. Upper source/drain regions of the transistors are arranged between two mutually adjacent isolating structures and between two mutually adjacent depressions. Lower source/drain regions are arranged in the substrate and adjoin the storage nodes. For process steps, alignment tolerances are so large that the space requirement for the memory cell can amount to 4F².

10 Claims, 5 Drawing Sheets

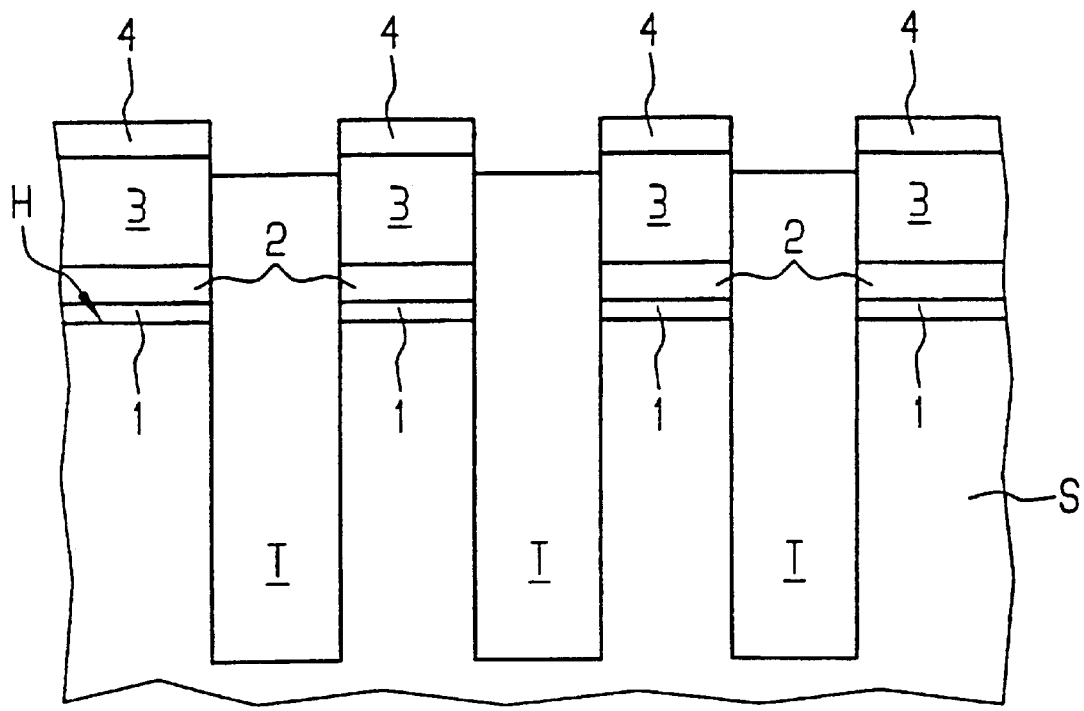
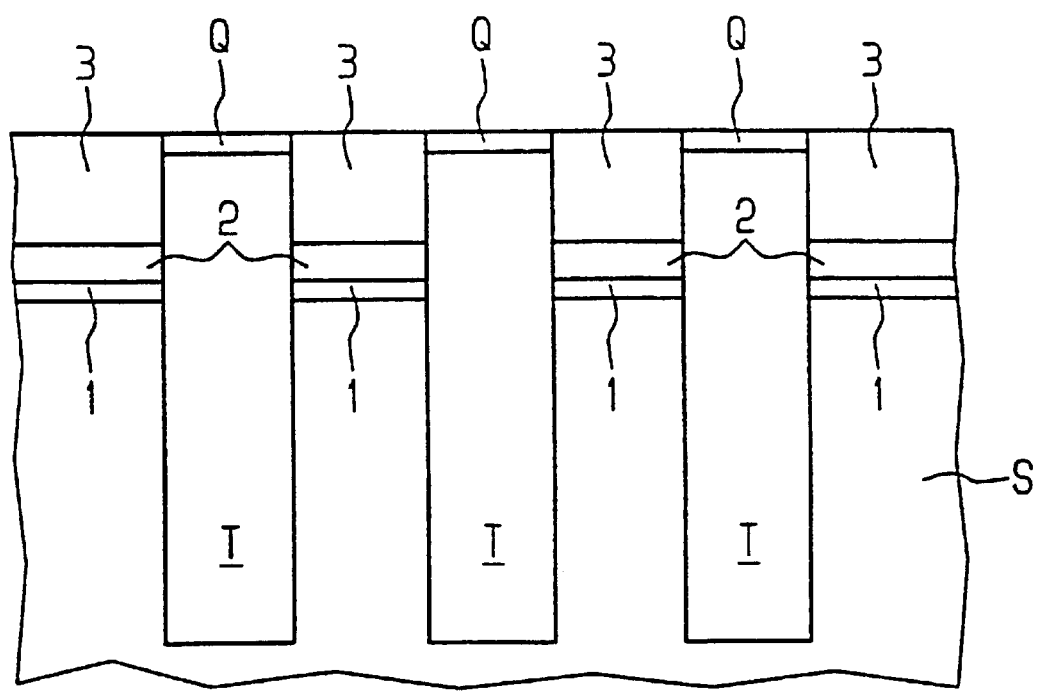

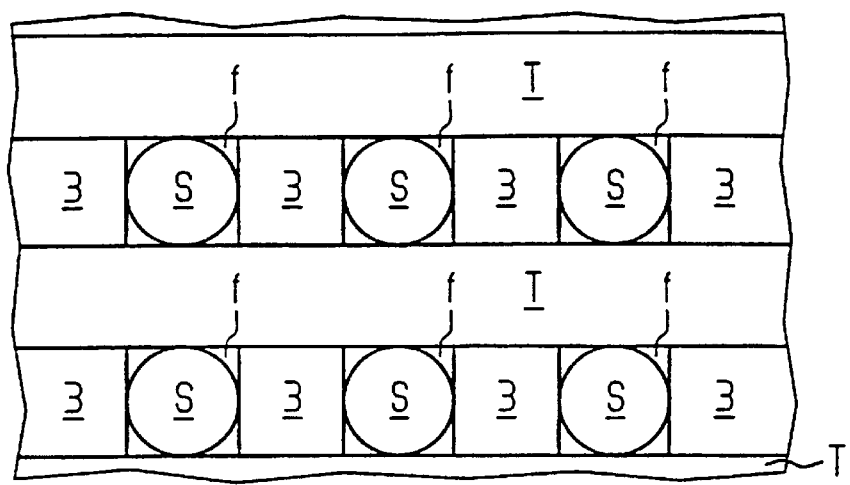
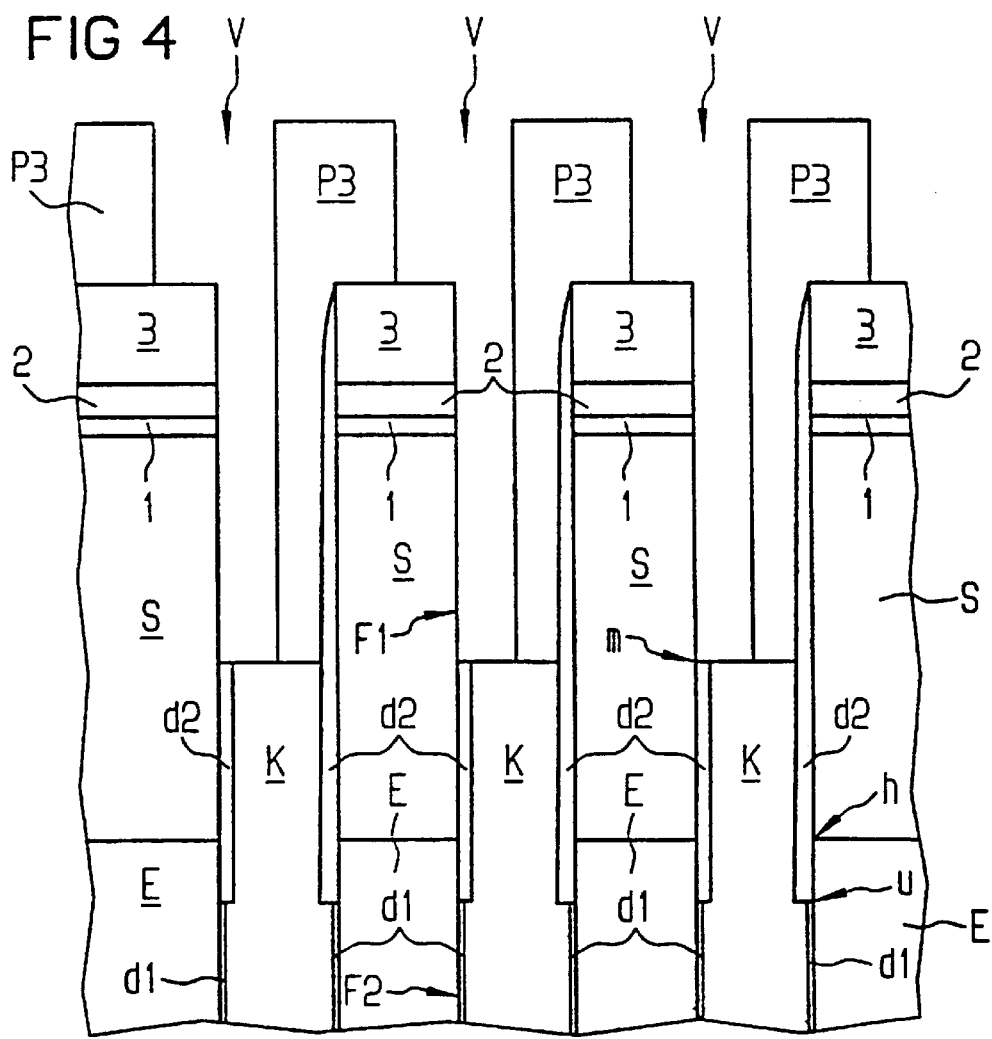

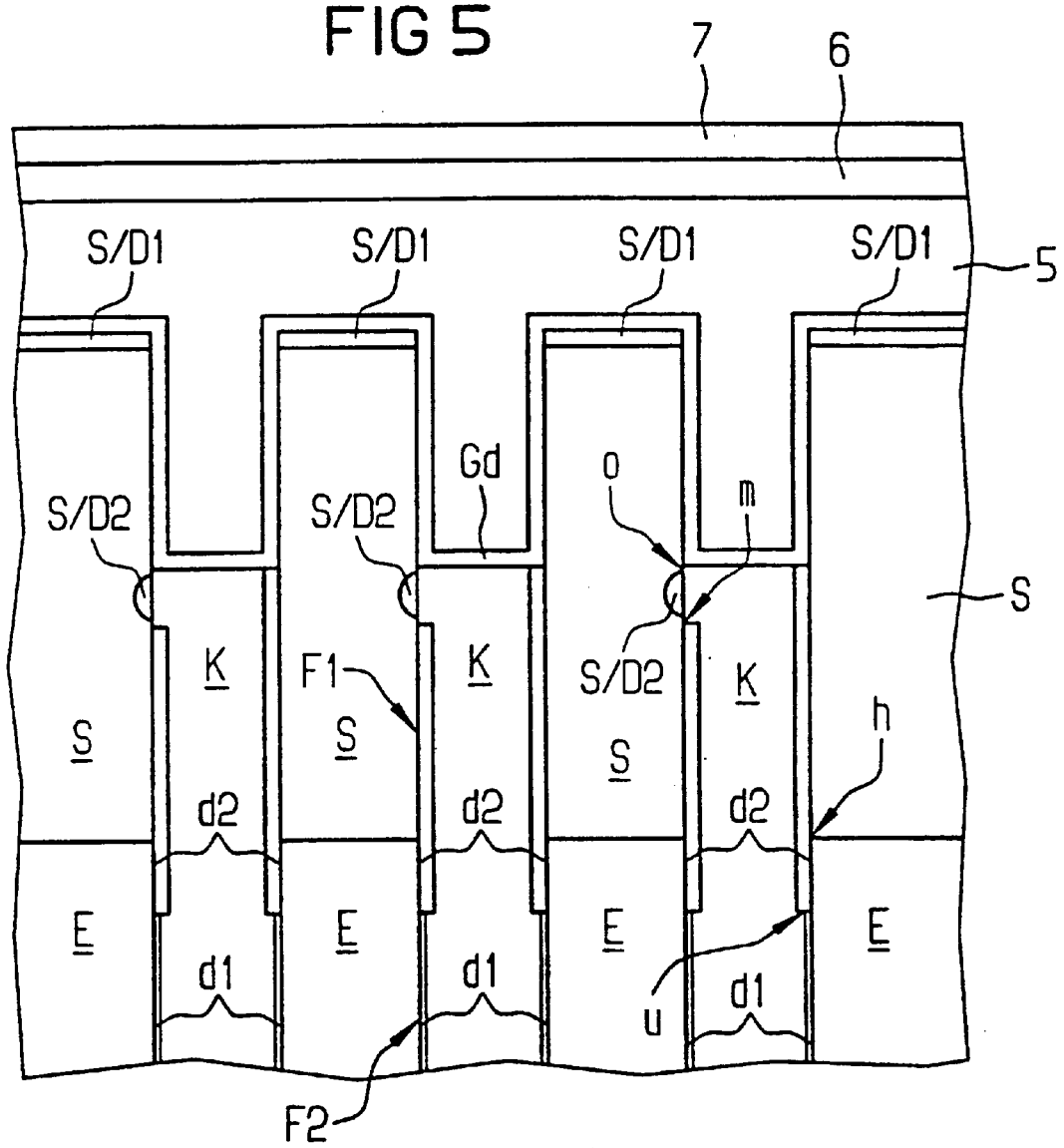

DRAM CELL SYSTEM AND METHOD FOR PRODUCING SAME

DESCRIPTION

DRAM cell arrangement and method for fabricating it

The invention relates to a DRAM cell arrangement and a method for fabricating it.

Endeavors are generally made to produce a DRAM cell arrangement with an ever higher packing density.

EP 0 852 396 describes a DRAM cell arrangement in which, in order to increase the packing density, a transistor of a memory cell is arranged above a storage capacitor of the memory cell. Active regions of the memory cells are in each case surrounded by an insulating structure arranged in a substrate. A depression is produced in the substrate for each memory cell, a storage node of the storage capacitor being arranged in the lower region of the said depression and a gate electrode of the transistor being arranged in the upper region of said depression. An upper source/drain region, a channel region and a lower source/drain region of the transistor are arranged one above the other in the substrate. The lower source/drain region is connected to the storage node at a first sidewall of the depression. The insulating structure adjoins a second sidewall—opposite to the first sidewall—of the depression, with the result that the storage node does not adjoin the substrate there. A capacitor electrode of the storage capacitor is formed by the addiffusion of dopant into the substrate. A lower region of the depression is widened by an isotropic etching process, areas of the upper region being protected in the process. As a result, a horizontal cross section of the lower region has a larger area than a horizontal cross section of the upper region. By virtue of the widening of the lower region of the depression, the surface area of a capacitor dielectric is enlarged and the capacitance of the storage capacitor is thus increased. A bit line adjoins the upper source/drain region and runs above the substrate. The depression is produced by etching the substrate selectively with respect to the bit lines with the aid of a strip-shaped mask whose strips run perpendicularly to the bit lines. A word line is produced together with a gate electrode by material being deposited in the upper region of the depression and being patterned. The gate electrode is insulated from the substrate and from the bit lines by a gate dielectric and by the insulating structure.

German patent specification 195 19 160 describes a DRAM cell arrangement in which a storage capacitor is arranged above a vertical transistor. With the aid of a mask widened by spacers, first trenches are produced, which cut through a layer sequence and are filled with a first insulation structure. Second trenches are then produced, which run transversely with respect to the first trenches and are shallower and wider than the first trenches. The second trenches are filled with a second insulation structure. The insulation structures are etched back to produce a lattice-shaped depression. After the production of the gate dielectric, in order to produce word lines, conductive material is deposited and etched back, with the result that, on account of the different widths of the trenches, the word lines are produced in a self-aligned manner in such a way that they run parallel to the second trenches. Parts of the layer sequence which are surrounded by the word lines act as the transistors. A capacitor dielectric is produced above the word lines and layer sequence, and a capacitor plate of the storage capacitors is produced above said capacitor dielectric. Upper parts of the layer sequence act as upper source/drain regions of the transistors and, at the same time, as capacitor electrodes of the storage capacitors. The memory cell can be fabricated with an area of $4F^2$, where F is the minimum feature size that can be fabricated in the technology used. Lower parts of the layer sequence act as bit lines which are isolated from one another by the first insulation structures and run parallel to the first trenches. Neither the word lines nor the bit lines have a high electrical conductivity.

The invention is based on the problem of specifying a DRAM cell arrangement whose word lines and bit lines can have a high electrical conductivity and which can, at the same time, be fabricated with a high packing density. Furthermore, the intention is to specify a method for fabricating it.

The problem is solved by means of a method for fabricating a DRAM cell arrangement, in which firstly first trenches running essentially parallel to one another are produced in a substrate. The first trenches are filled with isolating structures. By etching with the aid of a strip-shaped photoresist mask whose strips run transversely with respect to the first trenches, the substrate is etched selectively with respect to the isolating structures, with the result that depressions are produced. Areas of lower regions of the depressions are provided with a capacitor dielectric. A storage node of a storage capacitor is in each case produced in the lower regions of the depressions. Upper source/drain regions of the transistors are produced in such a way that they are in each case arranged between two mutually adjacent depressions of the depressions and between two mutually adjacent isolating structures of the isolating structures, and adjoin a main area of the substrate. At least first side walls of the depressions are provided with a gate dielectric in upper regions of the depressions. Lower source/drain regions of the transistors in the substrate are formed in such a way that they are electrically connected to the storage nodes, with the result that in each case one of the transistors and one of the storage capacitors are connected in series and form a memory cell. By depositing and patterning conductive material, word lines are produced, which run transversely with respect to the isolating structures and above the main area, and, adjoining them, gate electrodes of vertical transistors are produced, which are each arranged in one of the depressions and are electrically insulated from the storage nodes. An insulating layer is produced over the word lines. Insulating spacers are produced on side walls of the word lines by depositing material and etching it back. With the aid of a strip-shaped photoresist mask whose strips run essentially parallel to the isolating structures, etching is effected selectively with respect to the insulating layer and the spacers until the upper source/drain regions are uncovered. Bit lines are produced which make contact with the upper source/drain regions.

The problem is furthermore solved by means of a DRAM cell arrangement, in which a depression is provided in a substrate for a memory cell. The depression is arranged between strip-shaped isolating structures. Areas of a lower region of the depression are provided with a capacitor dielectric of a storage capacitor. A storage node of the storage capacitor is arranged in the lower region of the depression. A lower source/drain region of a vertical transistor is arranged in the substrate and is electrically connected to the storage node, with the result that the transistor and the storage capacitor are connected in series and form the memory cell. A first side wall of the depression is provided with a gate dielectric in an upper region of the depression. A gate electrode of the transistor is arranged in the upper region of the depression, said gate electrode being electrically insulated from the storage node. A word line runs above a main area of the substrate and transversely with respect to the isolating structures and adjoins the gate electrode. An insulating layer is arranged over the word line. Side walls of the word line are provided with insulating spacers. A bit line runs transversely with respect to the word line. Parts of the bit line are arranged between the spacers of mutually adjacent word lines and adjoin upper source/drain regions of the transistors of memory cells which are arranged on the main area of the substrate. The upper source/drain regions are isolated from one another by the depressions and the isolating structures and adjoin them.

The invention is based on the insight that it is advantageous to deposit materials having high electrical conductivities, such as metals for example, above the substrate since, on the one hand, they cover edges, formed for example by depressions in the substrate, poorly, that is to say non-uniformly, and, on the other hand, they should be arranged at a distance from the substrate in order to avoid contamination of the substrate. Moreover, mechanical strain or damage—caused by the deposition—of a surface of the substrate are thereby avoided.

Furthermore, the invention is based on the insight that the materials having high electrical conductivities are preferably applied at the end of a fabrication method, to ensure that there are no subsequent process steps at high temperatures which lead to degradation of underlying layers through interdiffusion in interfaces between the layers and the materials.

Since both the bit lines and the word lines run above the substrate they can contain materials having high electrical conductivities. Furthermore, the bit lines and/or the word lines can be produced at the same time as gate electrodes or transistors of a periphery of the DRAM cell arrangement by a layer or a layer sequence made of conductive materials being patterned by etching with the aid of a mask. The bit lines and the word lines have a so-called planar construction. In contrast to this, word lines and bit lines of the DRAM cell arrangement from the patent specification 195 19 160 cited above, which are arranged in depressions or are parts of the substrate, can have only a, rather, low electrical conductivity, the consequence of which is that electrical connections to higher, lower-impedance wiring planes already have to be produced after a small number of memory cells, with the result that the packing density of the DRAM cell arrangement is decreased and the complexity is increased through the number of wiring planes.

Both the word lines and the bit lines are produced after the production of the memory cells, so that metals can be used without the risk of contamination of the substrate or some other interaction with the substrate.

The bit lines can be produced by depositing and patterning one or more conductive materials with the aid of a strip-shaped photoresist mask whose strips run parallel to the isolating structures and at least partially do not cover the upper source/drain regions. As an alternative, an insulation covers the word lines, so that when the upper source/drain regions are uncovered, second trenches are produced in the insulation. The bit lines can be produced in a self-aligned manner, i.e. without the use of a mask to be aligned, in the second trenches by the conductive materials being deposited and etched back and/or subjected to chemical mechanical polishing until the insulation is uncovered.

Since the transistors are arranged as vertical transistors above the storage capacitors, the DRAM cell arrangement can have a high packing density. The space requirement per memory cell may amount to $4F^2$. To that end, the first trenches are produced with the aid of a photoresist mask whose strips have widths and distances between one another which amount to F. The strips of the photoresistor mask for the production of the depressions likewise have a width of approximately F and have distances between one another which amount to F. It lies within the scope of the invention if the aforementioned widths and distances amount to more than F.

The isolating structures enable self-aligned production of the upper source/drain regions between depressions that are adjacent to one another in the direction of the course of the bit lines. The upper source/drain region can be produced by patterning a doped layer of the substrate which adjoins the main area. The patterning is effected by the production of the isolating structures and of the depressions. As an alternative, the upper source/drain region can be produced by producing the depressions and the isolating structures and then carrying out an implantation.

It lies within the scope of the invention if, after the production of the depressions, the capacitor dielectric is applied and the depressions are then filled with conductive material up to a middle height. To that end, conductive material, such as doped polysilicon for example, can be deposited, planarized and etched back down to the middle height. Afterward, uncovered parts of the capacitor dielectric are removed, with the result that the capacitor dielectric covers areas of the depressions up to the middle height. Afterward, the depressions are filled further with conductive material up to an upper height, which lies above the middle height. The conductive material forms the storage nodes which adjoin the substrate between the middle height and the upper height. The lower source/drain regions are produced in such a way that they adjoin the storage nodes between the middle height and the upper height.

The lower source/drain regions can be produced from a doped layer buried in the substrate. The patterning is effected by the production of the isolating structures and of the depressions. As an alternative, the lower source/drain regions can be produced by dopant diffusing from the storage nodes into the substrate as a result of a heat-treatment step. This alternative is advantageous because channel regions of the transistors which are arranged between the isolating structures and the depressions and between the upper source/drain regions and the lower source/drain regions can be electrically connected to one another, with the result that floating body effects are avoided.

It is advantageous if the lower source/drain regions of the transistors in each case adjoin only the first side wall of the respectively associated depression and, in particular, not a second side wall—opposite to the first side wall—of the depression. Accordingly, the capacitor dielectric has a single cutout between the middle height and the upper height, which is situated on the first side wall of the depression and at which the storage node adjoins the lower source/drain region. This configuration makes it possible to increase the packing density of the DRAM cell arrangement since a distance between the second side wall and the first side wall of mutually adjacent depressions can be reduced without producing leakage currents between the associated storage nodes.

In order to produce such a DRAM cell arrangement, after the filling of the depressions up to the middle height, a photoresist mask is applied which covers the second side walls of the depressions. The uncovered parts of the capacitor dielectric are removed selectively with respect to the photoresist mask, with the result that the capacitor dielectric is preserved on the second side walls of the depressions. After the removal of the photoresist mask, the depressions, as already described, are filled further with conductive material up to the upper height, with the result that the storage nodes adjoin the substrate only at the first side walls of the depressions between the middle height and the upper height.

It is advantageous if the lower source/drain region which adjoins the first side wall of the associated depression does not adjoin the second side wall of a depression adjacent to the depression. This prevents driving of the associated transistor by the gate electrode of the adjacent depression.

The capacitor dielectric may also have a cutout on the second side wall of the depression. To that end, the photoresist mask which covers the second side walls of the depressions is dispensed with. The lower source/drain region comprises two parts. A first part of the lower source/drain region adjoins the first side wall and a second part of the lower source/drain region adjoins the second side wall of the depression. If the isolating structures are situated higher than the middle height, the capacitor dielectric also has cutouts on the remaining side walls of the depressions. The lower source/drain region is configured correspondingly.

Lower source/drain regions that are adjacent to one another transversely with respect to the isolating structures are preferably isolated from one another by the isolating structures. In this case, the lower source/drain region is arranged higher than a lower edge of the isolating structures, e.g. in the upper region of the depression. Consequently, a part of the storage node is also arranged in the upper region, and the middle height lies in the upper region. The first side walls of the depressions run transversely with respect to the course of the isolating structures.

In order to prevent a gate electrode of a depression from driving a transistor of the adjacent depression, it is advantageous if insulating structures which are thicker than the gate dielectric are arranged on the second sidewalls of the depressions. In order to increase the packing density, it is advantageous here if the insulating structures are arranged in the upper regions of the depressions instead of in the substrate. In order to produce the insulating structures, the word lines are produced offset with respect to the depressions in such a way that the gate electrodes adjoin parts of the first side walls which are provided with the gate dielectric, but not the second side walls of the depressions. During the production of the word lines, a strip-shaped photoresist mask is used whose strips cover the first side walls of the depressions but not the second side walls. Afterward, insulating material is deposited and etched back, with the result that the insulating structures are produced in a manner adjoining the second side walls.

A capacitor electrode of the capacitor is arranged in the substrate and adjoins the capacitor dielectric. The capacitor electrode may be configured as a doped substrate layer common to all of the capacitors. The doped layer may be produced e.g. by epitaxy or implantation prior to the production of the memory cells. As an alternative, a dopant source is introduced in the depressions, from which source dopant diffuses into the substrate, and forms the doped layer there, in a heat-treatment step.

The dopant source is e.g. arsenic glass. After the production of the depressions, the arsenic glass is deposited, with the result that areas of the depressions are covered. The lower regions of the depressions provided with the arsenic glass are filled with e.g. photoresist. Uncovered arsenic glass is subsequently removed. It is advantageous to grow a protective oxide after the removal of the photoresist. The protective oxide prevents arsenic from evaporating during the subsequent heat-treatment step during which arsenic diffuses from the arsenic glass into the substrate. The capacitor electrode is produced as an arsenic-doped part of the substrate which surrounds the lower regions of the depressions.

It is advantageous if the first sidewall is plane in the upper region of the depression and is curved in the lower region of the depression. The growth of the gate dielectric produced by thermal oxidation depends on the orientation of the relevant parts of the first sidewall relative to the crystal structure of the substrate. If these parts of the first sidewall are plane, the gate dielectric can grow homogeneously since a plane area, in contrast to a curved area, has a defined orientation relative to the crystal structure. Control characteristics of the transistor in which the gate dielectric has a homogeneous thickness have a particularly high subthreshold transconductance. If a part of the capacitor dielectric is grown by thermal oxidation on an area having an edge, the oxide turns out to be particularly thin on the edge. It is therefore possible for leakage currents to arise in the region of the edge. Therefore, it is advantageous if the capacitor dielectric is produced on an area having no edges. Even if the capacitor dielectric is produced by depositing material, edges in the area have a disadvantageous effect since field distortions occur at the edges and can reduce the breakdown voltage of the capacitor.

It lies with in the scope of the invention if the upper region has an essentially rectangular cross section which is larger than a cross section of the lower region, which is essentially circular or elliptic. To that end, after the production of the upper regions of the depressions, auxiliary spacers are produced in the depressions by depositing material and anisotropically etching it back. The auxiliary spacers are rounded by an isotropic etching process, with the result that uncovered parts of bottoms of the depressions have a circumference without corners. The lower regions of the depressions are subsequently produced by anisotropic etching selectively with respect to the auxiliary spacers.

In order to increase the capacitance of the storage capacitor, it is advantageous if the lower region of the depression is subsequently extended by isotropically etching the substrate, with the result that its cross section is enlarged. This enlarges the area of the lower region on which the capacitor dielectric is arranged, with the result that the capacitance of the storage capacitor is increased.

It is advantageous if the capacitor dielectric has a first part, which covers areas of the lower regions of the depressions up to a lower height, which lies below the middle height, and a second part, which is thicker than the first part and covers areas of the depressions between the lower height and the middle height.

Depending on the conductivity types chosen, a pnp junction or an npn junction is formed by the lower source/drain region, the substrate and the capacitor electrode, which junction, driven by the storage node, can cause leakage currents. Thus, if the capacitor dielectric is particularly thick between the capacitor electrode and the second source/drain region, the storage node no longer drives the junction and leakage currents are avoided.

In order to produce such a capacitor dielectric, after the production of the depression, the first part of the capacitor dielectric is applied over the whole area. Afterward, the depressions are filled with conductive material up to the lower height and uncovered parts of the first part of the capacitor dielectric are removed. Afterward, the second part of the capacitor dielectric is applied over the whole area and removed by being etched back on horizontal areas. The depressions are subsequently filled with conductive material up to the middle height, as already described.

A method is described below which prevents the situation where, on account of the finite selectivity of etching processes, an upper area of the isolating structures lies below the main area after the production of the depressions. Prior to the production of the isolating structures, a lower layer made of a first material is applied on the main area and an upper layer made of a second material is applied over said lower layer. The isolating structures are subsequently produced, the first material being used to fill the first trenches. An upper area of the isolating structures lies above the main area but below an upper area of the lower layer. By depositing and planarizing the second material until the lower layer is uncovered, auxiliary structures made of the second material are produced above the isolating structures. Afterward, the depressions are produced with the aid of the strip-shaped mask by firstly etching the first material selectively with respect to the second material, with the result that the upper area of the isolating structures lies above the main area in an unchanged manner, since the auxiliary structures protect the isolating structures. The depressions can subsequently be produced by etching uncovered parts of the substrate, the isolating structures and the lower layer serving as mask. In this case, on account of the finite selectivity of the etching process, the isolating structures and the lower layer are removed whose upper areas do not sink below the main area on account of the sufficient thickness of the lower layer during the production of the depressions.

The substrate may contain silicon and/or germanium and is preferably monocrystalline in order that the gate dielectric can be produced by thermal oxidation.

The bit lines and the word lines may be constructed in a multilayer manner. By way of example, it is possible to provide in each case a lower layer made of doped polysilicon and, above that, a layer made of a material having better electrical conductivity, e.g. silicide or metal.

An exemplary embodiment of the invention is explained in more detail below with reference to the figures.

FIG. 1a shows a cross section through a substrate after a first layer, a second layer, a third layer, a fourth layer and isolating structures have been produced.

FIG. 1b shows the cross section from FIG. 1a after the fourth layer has been removed and auxiliary structures have been produced.

FIG. 2b shows a cross section—perpendicular to the cross section from FIG. 1a—through the substrate after the process steps from FIG. 2a.

FIG. 3 shows the plan view from FIG. 2a after the auxiliary spacers have been rounded.

FIG. 4 shows the cross section from FIG. 2b after a lower region of the depression, a capacitor dielectric, a storage node and a photoresist mask have been produced.

FIG. 5 shows the cross section from FIG. 4 after a gate dielectric, upper source/drain regions, lower source/drain regions, a fifth layer, a sixth layer and a seventh layer have been produced.

FIG. 6b shows a cross section—parallel to the cross section from FIG. 6a—through the substrate after the process steps from FIG. 6a.

Figure 2A:
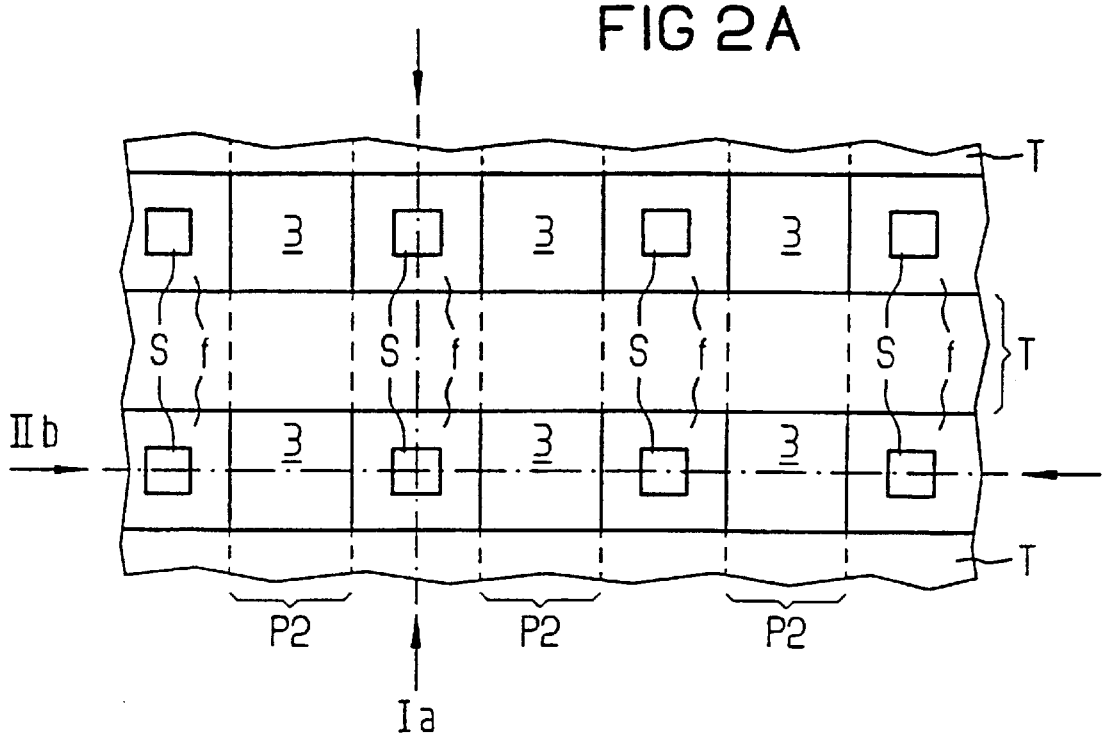
FIG. 2a shows a plan view of the substrate from FIG. 1b after upper regions of depressions and auxiliary spacers have been produced. Furthermore, the position of a photoresist mask is illustrated.

The figures are not true to scale.

In an exemplary embodiment, a p-doped substrate S made of silicon is provided as the starting material, which is p-doped with a dopant concentration of approximately $10^{18}$ $cm^{-3}$ in a layer adjoining a main area H of the substrate S. There is deposited on the main area H a first layer 1 made of $SiO_2$ and having a thickness of approximately 20 nm, over that a second layer 2 made of silicon nitride and having a thickness of approximately 100 nm, over that a third layer 3 made of $SiO_2$ and having a thickness of approximately 800 nm, and over that a fourth layer 4 made of silicon nitride and having a thickness of approximately 100 nm (see FIG. 1a).

With the aid of a strip-shaped first photoresist mask (not illustrated), the fourth layer 4, the third layer 3, the second layer 2, the first layer 1 and the substrate S are etched anisotropically, with the result that first trenches are produced in the substrate S, said trenches having a depth of approximately 300 nm, a width of approximately 100 nm and distances of approximately 100 nm between one another. Suitable etchants are, for example, $CF_4$, $CHF_3$, $C_2F_6$ and HBr, which are combined in accordance with the material to be etched.

Isolating structures T are produced in the first trenches by $SiO_2$ being deposited conformally to a thickness of approximately 200 nm and being planarized by chemical mechanical polishing until an upper area of the fourth layer 4 is uncovered. Afterward, $SiO_2$ is etched back selectively with respect to the silicon nitride, with the result that an upper area of the isolating structures T lies below an upper area of the third layer 3 (see FIG. 1a).

Afterward, silicon nitride is deposited and planarized by chemical mechanical polishing until the upper area of the third layer 3 is uncovered. In this way, auxiliary structures Q made of silicon nitride are arranged above the isolating structures T (see FIG. 1b).

With the aid of a strip-shaped second photoresist mask P2 (see FIG. 2a) whose strips run transversely with respect to the strips of the first photoresist mask, $SiO_2$ is etched selectively with respect to silicon nitride, using $C_4F_6$, CO, for example, until the second layer 2 is partially uncovered. Silicon nitride is subsequently etched, with the result that the auxiliary structures Q and uncovered parts of the second layer 2 are removed. By etching silicon selectively with respect to $SiO_2$, on account of the finite selectivity of the etching process, firstly the first layer 1 is partially cut through and then upper regions of depressions V are produced. In this case, the isolating structures T and the third layer 3 act as a thick mask. The upper regions of the depressions V have a depth of approximately 300 nm in the substrate S and have cross sections parallel to the main area H which are square and whose dimensions are approximately 100 nm. Distances between mutually adjacent depressions V are approximately 100 nm between one another (see FIGS. 2a and 2b).

Figure 2B:
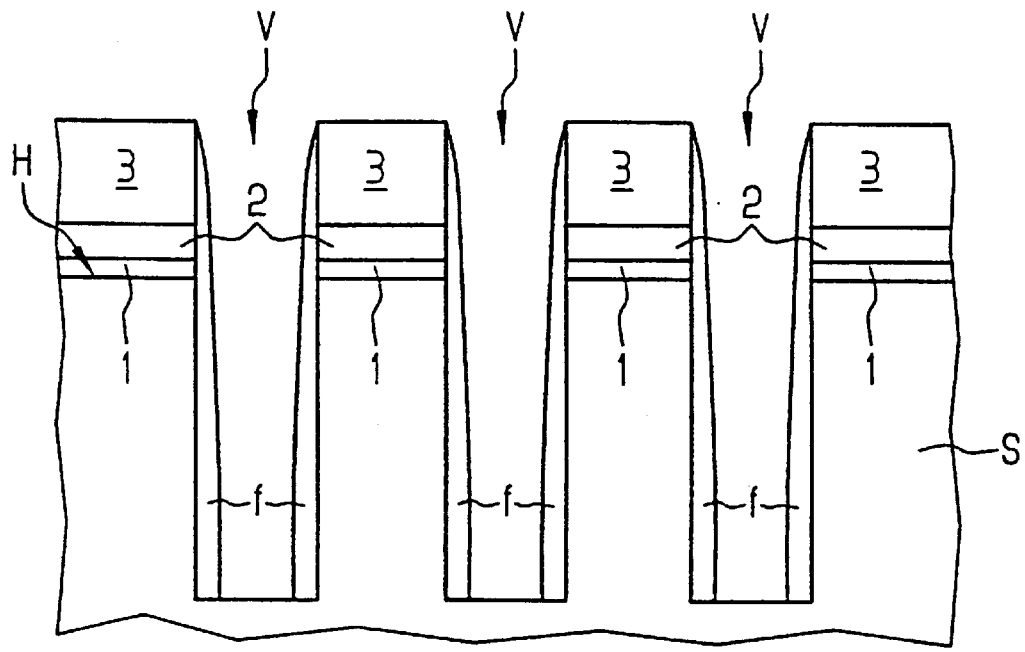

Auxiliary spacers f are produced in the depressions V by $SiO_2$ being deposited to a thickness of approximately 30 nm and etched back anisotropically (see FIGS. 2a and 2b). Uncovered parts of the bottoms of the depressions are essentially square and have a side length of approximately 40 nm.

For the rounding of the auxiliary spacers f, isotropic etching back is subsequently carried out using $CF_4$, for example, as etchant (see FIG. 3). Uncovered parts of the bottoms of the depressions V are essentially circular and have a diameter of approximately 100 nm.

Afterward, silicon is anisotropically etched selectively with respect to $SiO_2$ using HBr, for example, thereby producing lower regions of the depressions V which, on account of the auxiliary spacers f acting as mask, have circular horizontal cross sections. The depressions V now have depth of approximately 7 μm (see FIG. 4). The isolating structures T and the third layer 3 act as a thick mask during the etching process.

The upper regions of the depressions V each have four lateral plane first areas F1. The lower regions of the depressions V have a curved second area F2. A horizontal cross section, i.e. a cross section parallel to the main area H, of the lower region of one of the depressions V has a curved circumference. A part of the substrate S is arranged, in particular, under corners of the upper regions of the depressions V since the auxiliary spacers f cover at least the corners and, consequently, deeper etching is not effected there.

In order to produce a capacitor electrode E of capacitors, arsenic glass is deposited to a thickness of approximately 10 nm. The depressions V provided with the arsenic glass are filled with photoresist up to a height h of approximately 1 μm below the main area H (cf. FIG. 4). Uncovered arsenic glass is subsequently removed. After the removal of the photoresist, a protective oxide (not illustrated) is grown. The protective oxide prevents arsenic from evaporating during a subsequent heat-treatment step at approximately 1000° C. during which arsenic diffuses from the arsenic glass into the substrate S. As a result, the capacitor electrode E is produced as an arsenic-doped part of the substrate S which surrounds parts of the lower regions of the depressions V (see FIG. 4). The protective oxide and the auxiliary spacers f are subsequently removed using dilute hydrofluoric acid.

In order to produce a first part d1 of a capacitor dielectric, areas of the depressions V are provided with silicon nitride which is subsequently partially oxidized, with the result that the first part d1 of the capacitor dielectric is produced as a so-called NO layer having an approximately 3 nm oxide-equivalent thickness (see FIG. 4).

In order to produce storage nodes K of the capacitors, in-situ-doped polysilicon is deposited to a thickness of approximately 100 nm and planarized by chemical mechanical polishing until the second layer 2 is uncovered. In the process, the third layer 3 is removed and the isolating structures T are removed somewhat. Afterward, the polysilicon is etched back by anisotropic etching down to a depth of 1.1 μm below the main area H, with the result that the depressions V are filled with polysilicon up to a lower height u (see FIG. 4). Uncovered parts of the first part d1 of the capacitor dielectric are removed using hydrofluoric acid, for example.

In order to produce a spacer-type second part d2 of the capacitor dielectric in the depressions V, $SiO_2$ is deposited to a thickness of approximately 15 nm and etched back anisotropically (see FIG. 4). The second part d2 of the capacitor dielectric is thicker than the first part d1.

The storage nodes K are enlarged by depositing in-situ-doped polysilicon to a thickness of approximately 100 nm and subsequently etching it back down to a depth of approximately 250 nm below the main area H. The depressions V are filled with polysilicon up to a middle height m (see FIG. 4).

With the aid of a multilayer photoresist mask P3 (see FIG. 4), parts of the second part d2 of the capacitor dielectric are removed. On first sidewalls of the depressions V, the second part d2 of the capacitor dielectric extends only from the lower height u up to the middle height m.

Afterward, in-situ-doped polysilicon is deposited to a thickness of approximately 100 nm and planarized by chemical mechanical polishing until the second layer 2 is uncovered.

Below the first layer 1, upper source/drain regions S/D1 of vertical transistors are produced by implantation with n-doping ions in the substrate S, said source/drain regions having a thickness of approximately 30 nm. On account of the isolating structures T and the depressions V, the upper source/drain regions D/D1 have square horizontal cross sections with a side length of approximately 100 nm. Mutually adjacent upper source/drain regions S/D1 are isolated from one another by the isolating structures T or by the depressions V.

The polysilicon is subsequently etched back down to a depth of approximately 200 nm below the main area H, with the result that the storage nodes K are thickened further. The depressions V are filled with polysilicon up to an upper height h (see FIG. 5a). The storage nodes K adjoin the substrate S at the first sidewalls of the depressions V between the middle height m and the upper height o. Up per parts of the storage nodes K are arranged in the upper regions of the depressions V.

By means of a heat-treatment step, dopant diffuses from the storage node K into the substrate S, thereby producing lower source/drain regions S./D2 of the transistors, which adjoin the first sidewalls of the depressions V in the region between the middle height m and the upper height o.

The second layer 2 is subsequently removed using, for example, hot phosphoric acid as etchant.

By means of thermal oxidation, a gate dielectric Gd is produced on sidewalls of the upper regions of the depressions V, on the main area H and on the storage nodes K (see FIG. 5).

Afterward, a fifth layer 5 made of in-situ-doped polysilicon is deposited to a thickness of approximately 60 nm, thereby filling the upper regions of the depressions V. Above that are deposited a sixth layer 6 made of tungsten silicide and having a thickness of approximately 50 nm and a seventh layer 7 made of silicon nitride and having a thickness of approximately 100 nm (see FIG. 5).

With the aid of a strip-shaped fourth photoresist mask (not illustrated), whose strips run transversely with respect to the isolating structures T, the seventh layer 7, the sixth layer 6 and the fifth layer 5 are etched until the gate dielectric Gd is uncovered. In each case a part of the fifth layer 5 and a part of the sixth layer 6 which adjoin one another form a word line which is covered by the insulating seventh layer 7 (see FIG. 6a). The word lines are approximately 100 nm wide and have a distance of approximately 100 nm between one another. The word lines are arranged offset with respect to the depressions V, with the result that first parts of the word lines have a strip-shaped horizontal cross section and run over parts of the upper source/drain regions S/D1 covered by the gate dielectric Gd. The second parts of the word lines are arranged in the upper regions of the depressions V, on the first side walls thereof. The word lines have a metallic conductivity.

Figure 6A:
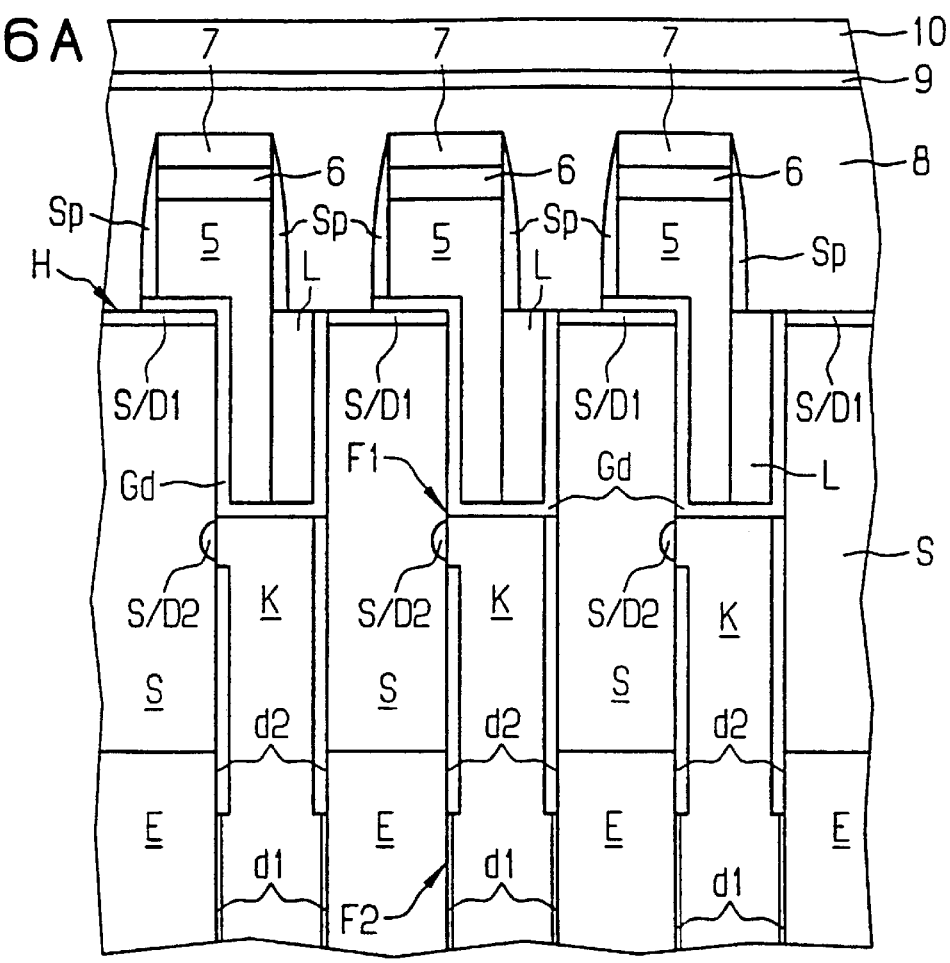
FIG. 6a shows the cross section from FIG. 5 after the fifth layer and the sixth layer have been patterned to form word lines, and spacers, an insulation (illustrated in FIG. 6b), an eighth layer and a ninth layer, which form bit lines, and a tenth layer have been produced.

In order to produce insulating structures L in the depressions V, $SiO_3$ is deposited in a thickness of approximately 50 nm and etched back until the gate dielectric Gd, whose density means that it can be etched less well, is uncovered (see FIG. 6a).

In order to encapsulate the word lines, spacers Sp are produced by silicon nitride being deposited to a thickness of approximately 15 nm and being etched back anisotropically (see FIG. 6a).

Figure 6B:
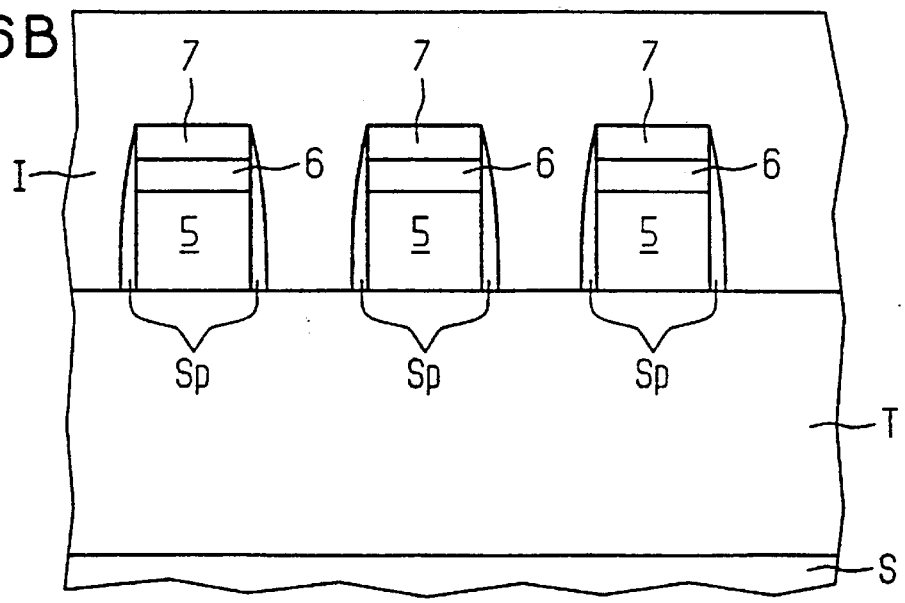

In order to produce an insulation I, $SiO_2$ is deposited to a thickness of approximately 50 nm and planarized by chemical mechanical polishing until a plant area is produced (see FIG. 6b).

With the aid of strip-shaped fifth photoresist mask (not illustrated), whose strips are in each case arranged above one of the isolating structures R, $SiO_2$ is etched until the upper source/drain region S/D1 are uncovered and second trenches are produced in the insulation I, which are particularly deep in regions between the word lines and form contact holes (see FIG. 6a). Parts of the gate dielectric Gd are removed in the process. The insulating seventh layer 7 and the spacers Sp in this case protect the word lines, resulting in a large alignment tolerance for the second trenches.

In order to produce bit lines, an eighth layer 8 made of in-situ doped polysilicon is deposited to a thickness of approximately 50 nm, with the result that the second trenches are filled. Afterward, the polysilicon is etched back until there is approximately 30 nm of polysilicon above the seventh layer. Above that, a ninth layer 9 made of titanium nitride and titanium and having a thickness of approximately 20 nm and a tenth layer 10 made of tungsten and having a thickness of approximately 60 nm are deposited and planarized by chemical mechanical polishing until the insulation I is uncovered, with the result that bit lines are produced in a self-aligned manner in the second trenches from the eighth layer 8, the ninth layer 9 and the tenth layer 10, the first parts of the bit lines form strips running transversely with respect to the word lines, and second parts of the bit lines fill the contact holes and are arranged between mutually adjacent word lines (see FIG. 6a). The bit lines have metallic conductivity.

A DRAM cell arrangement is produced in the exemplary embodiment. A memory cell comprises one of the vertical transistors and one of the capacitors, which is connected in series with the transistor. The gate dielectric of the transistor is arranged on one of the plane first areas F1. The first part of the capacitor dielectric is arranged on the curved second area F2.

Parts of the word lines which are arranged on the first side walls of the upper regions of the depressions V act as gate electrodes of the transistors. The insulating structures L on the second side walls of the depressions V prevent the word line arranged in the depression V from driving a transistor which is arranged on a depression V which is adjacent to the depression V.

Channel regions of the transistors are parts of the substrate S which are arranged between the upper source/drain regions S/D1 and the lower source/drain regions S/D2. The channel regions of the transistors are connected to one another, with the result that floating body effects are avoided on account of the sufficiently high dopant concentration of the layer of the substrate S which adjoins the main area H.

There are many conceivable variations of the exemplary embodiment which likewise lie within the scope of the invention. Thus, dimensions of the layers, depressions, structures can be adapted to the respective requirements. The same applied to the dopant concentrations and to the choice of materials. Thus, the word lines and bit lines may also contain different conductive materials than those referred to in the exemplary embodiment.

The lower source/drain region of one of the transistors may be divided in two, so that a first part adjoins the first side wall and a second part adjoins the second side wall of the associated depression. In this case, no mask is used during the removal of the second part of the capacitor dielectric as far as the middle height, with the result that the second part of the capacitor dielectric on the second side walls of the depressions is likewise removed as far as the middle height. The storage node adjoins the substrate both at the first side wall and at the second side wall.

The insulating structures can be dispensed with if the distance between the second side wall of the depression and the lower source/drain region of the transistor of the adjacent depressions is large enough.

If the insulating structures are provided, the lower source/drain regions can be produced by patterning a doped layer of the substrate instead of by addiffusion of dopant.

The insulating structures can be produced as follows: during the encapsulation of the word lines, the silicon nitride is deposited to a thickness such that the depressions are filled. In this case, the insulating structures are composed of silicon nitride.

What is claimed is:

1. A method for fabricating a DRAM cell arrangement in which first trenches running essentially parallel to one another are produced in a substrate, in which the first trenches are filled with isolating structures, in which, by etching, with the aid of a strip-shaped photresist mask whose strips run transversely with respect to the first trenches, the substrate is etched selectively with respect to the isolating structures, with the result that depressions are produced, in which areas of lower regions of the depressions are provided with a capacitor dielectric, in which a storage node of a storage capacitor is in each case produced in the lower regions of the depressions, in which upper source/drain regions of the transistors are produced in a manner adjoining a main area of the substrate in such a way that they are in each case arranged between two mutually adjacent depressions of the depressions and between two mutually adjacent isolating structures of the isolating structures, in which at least first side walls of the depressions are provided with a gate dielectric in upper regions of the depressions, in which lower source/drain regions of the transistors are formed in the substrate in such a way that they are electrically connected to the storage nodes, with the result that in each case one of the transistors and one of the storage capacitors are connected in series and form a memory cell, in which, by depositing and patterning conductive material, word lines are produced, which run transversely with respect to the isolating structures and above the known area, and, adjoining them, gate electrodes of vertical transistors are produced, which are each arranged in one of the depressions and are electrically insulated from the storage nodes, in which insulating spacers are produced on the word lines by depositing material and etching it back, in which, with the aid of a strip-shaped photoresist mask whose strips run essentially parallel to the isolating structures, etching is effected selectively with respect to the insulation layer and the spacers until the upper source/drain regions are uncovered, in which bit lines are produced which mark contact with the upper source/drain regions, characterized in that firstly the upper region of the depressions is produced using a strip-shaped photoresist mask, whose strips run transversely with respect to the first trenches, in such a way that it has an essentially rectangular horizontal cross section, in which rounded auxiliary spacers are produced in the depressions by depositing material and anisotropically etching it back, in which the auxiliary spacers are rounded by an isotropic etching process, with the result that uncovered parts of bottoms of the depressions have a circumference without corners, in which the lower regions of the depressions are produced by anisotropic etching selectively with respect to the rounded auxiliary spacers.

2. The method as claimed in claim 1, in which an insulation (I) is produced which covers the insulating layer (7), in which, during the process of etching selectively with respect to the insulating layer (7) and with respect to the spacers (Sp), second trenches are produced in the insulation (I), in which the bit lines are produced in a self-aligned manner in the second trenches by at least one conductive material being deposited and removed until the insulation (I) is uncovered.

3. The method as claimed in claim 1, in which the lower regions of the depressions (V) are extended by isotropic etching selectively with respect to the auxiliary spacers (f), with the result that a horizontal cross section of the lower regions is larger than a horizontal cross section of the upper regions.

4. The method as claimed in claim 1, in which, after the production of the depressions (V), the capacitor dielectric (d1, d2) is applied, in which the depressions (V) are filled with conductive material up to a middle height (m), in which uncovered plots of the capacitor dielectric (d1, d2) are removed, in which the depressions (V) are filled further by conductive material up to an upper height (o), which lies above the middle height (m), with the result that storage nodes (K) which are at least partially arranged in the lower regions of the depressions (V) are produced from the conductive material, in which the lower source/drain regions (S/D2) are produced in such a way that they adjoin the storage nodes (K) between the middle h eight (m) and the upper height (o).

5. The method as claimed in claim 4, in which, after the production of the depressions (V), a first part (d1) of the capacitor dielectric is applied, in which the depressions (V) are filled by conductive material up to a lower height (u), which lies below the middle height (m), in which uncovered parts of the first part (d1) of the capacitor dielectric are removed, in which a second part (d2) of the capacitor dielectric is applied, which is thicker than the first part (d1) of the capacitor dielectric, in which the depressions (V) are filled with conductive material up to the middle height (m).

6. The method as claimed in claim 4, in which, after the filling of the depressions up to the middle height, the uncovered parts of the capacitor dielectric are removed in such a way that etching is effected selectively with respect to a photoresist mask.

7. The method as claimed in claim 6, in which the word lines are produced offset with respect to the depressions (V), with the result that the gate electrodes adjoin those parts of the first side walls of the depressions (V) which are provided with the gate dielectric (Gd), but not second side walls—opposite to the first side walls—of the depressions (V), in which insulating material is deposited and etched back, with the result that insulating structures (L) which adjoin the second side walls and the gate electrode are produced in the depressions (V).

8. The method as claimed in claim 1, in which, in order to produce the lower source/drain regions (S/D2), a heat-treatment step is carried out, with the result that dopant diffusers from the storage node (K) into the substrate (S).

9. The method as claimed in claim 1, in which, after the productions of the depressions (V), dopant is diffused into the substrate (S), thereby producing the substrate (S) capacitor electrodes (E) f the storage capacitors which merge with one another and surround parts of the lower regions of the depressions (V).

10. The method as claimed in claim 1, in which an upper layer made of a second material is applied on a lower layer, in which the isolating structures are produced in such a way that they are composed of a first material and that an upper area of the isolating structures lies above the main area and below an upper area of the lower layer, in which auxiliary structures made of the second material are produced above the isolating structures, in which the second material is etched until the lower layer is uncovered, with the result that a part of the auxiliary structures is preserved, in which, using the strip-shaped photoresist mask for the production of the depressions, firstly the first material is etched selectively with respect to the second material, with the result that the upper area of the isolating structures lies above the main area in an unchanged manner, in which the depressions are produced, the upper area of the isolating structures not sinking below the main area, despite a finite selectivity of the etching process used.

* * * * *